(12) United States Patent
Yui et al.

(10) Patent No.: US 8,987,015 B2
(45) Date of Patent: Mar. 24, 2015

(54) METHOD FOR FABRICATING SEMICONDUCTOR DEVICE

(75) Inventors: Keiichi Yui, Kanagawa (JP); Akira Furuya, Kanagawa (JP); Ken Nakata, Kanagawa (JP); Takamitsu Kitamura, Kanagawa (JP); Isao Makabe, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 224 days.

(21) Appl. No.: 13/172,403

(22) Filed: Jun. 29, 2011

(65) Prior Publication Data

US 2012/0003821 A1 Jan. 5, 2012

(30) Foreign Application Priority Data

Jun. 30, 2010 (JP) ................................. 2010-150060

(51) Int. Cl.
*H01L 21/20* (2006.01)
*H01L 21/02* (2006.01)
*C30B 25/14* (2006.01)
*C30B 25/18* (2006.01)
*C30B 29/40* (2006.01)

(52) U.S. Cl.
CPC ............ *H01L 21/0262* (2013.01); *C30B 25/14* (2013.01); *C30B 25/186* (2013.01); *C30B 29/403* (2013.01); *H01L 21/02381* (2013.01); *H01L 21/02458* (2013.01); *H01L 21/02502* (2013.01); *H01L 21/0254* (2013.01); *H01L 21/02661* (2013.01)
USPC ........................ 438/22; 438/478; 257/E21.09

(58) Field of Classification Search
USPC .............................................. 438/22–47, 478
See application file for complete search history.

(56) References Cited

U.S. PATENT DOCUMENTS 6,303,473 B1 * 10/2001 Heffernan et al. ............ 438/483
6,391,748 B1 * 5/2002 Temkin et al. ................ 438/478

(Continued)

FOREIGN PATENT DOCUMENTS

JP 2007-59850 A 3/2007
JP 2007-281478 A 10/2007

(Continued)

OTHER PUBLICATIONS

Japanese Office Action dated Mar. 4, 2014, issued in corresponding Japanese Patent Application No. 2010-150060, w/English translation (6 pages).

*Primary Examiner* — Savitr Mulpuri
(74) *Attorney, Agent, or Firm* — Westerman, Hattori, Daniels & Adrian, LLP (57) ABSTRACT

A method for fabricating a semiconductor device includes performing thermal cleaning for a surface of a silicon substrate in an atmosphere including hydrogen under a condition that a thermal cleaning temperature is higher than or equal to 700° C. and is lower than or equal to 1060° C., and a thermal cleaning time is longer than or equal to 5 minutes and is shorter than or equal to 15 minutes; forming a first AlN layer on the substrate with a first V/III source ratio, the forming of the first AlN layer including supplying an Al source to the surface of the substrate without supplying a N source, and supplying both the Al source and the N source; forming a second AlN layer on the first AlN layer with a second V/III source ratio that is greater than the first ratio; and forming a GaN-based semiconductor layer on the second AlN layer.

9 Claims, 6 Drawing Sheets

(56) References Cited

U.S. PATENT DOCUMENTS

| | | | |
|---|---|---|---|
| 6,869,702 B2* | 3/2005 | Shibata et al. | 428/698 |
| 7,566,580 B2* | 7/2009 | Keller et al. | 438/46 |
| 8,264,006 B2* | 9/2012 | Imanishi et al. | 257/200 |
| 8,324,005 B2* | 12/2012 | Saxler et al. | 438/47 |
| 2006/0094145 A1* | 5/2006 | Otsuka et al. | 438/31 |
| 2006/0261370 A1* | 11/2006 | Hoke et al. | 257/194 |
| 2007/0045662 A1* | 3/2007 | Sumiya et al. | 257/189 |
| 2007/0238315 A1 | 10/2007 | Cheng et al. | |
| 2008/0210949 A1* | 9/2008 | Makabe et al. | 257/76 |
| 2009/0008647 A1* | 1/2009 | Li et al. | 257/76 |
| 2010/0090244 A1* | 4/2010 | Ohba | 257/98 |
| 2010/0240198 A1* | 9/2010 | Yokoyama | 438/507 |
| 2011/0254048 A1 | 10/2011 | Amano et al. | |
| 2012/0025252 A1* | 2/2012 | Ichizono et al. | 257/98 |

FOREIGN PATENT DOCUMENTS

| | | |
|---|---|---|
| JP | 2008-166349 A | 7/2008 |
| JP | 2009-231550 A | 10/2009 |
| WO | 2009/020235 A1 | 2/2009 |

* cited by examiner

METHOD FOR FABRICATING SEMICONDUCTOR DEVICE

CROSS-REFERENCE TO RELATED APPLICATION

This application is based upon and claims the benefit of priority of the prior Japanese Patent Application No. 2010-150060 filed on Jun. 30, 2010, the entire contents of which are incorporated herein by reference.

BACKGROUND (i) Technical Field

A certain aspect of the embodiments discussed herein is related to a method for fabricating a semiconductor device. Another aspect of the embodiments is related to a method for fabricating a semiconductor device in which a GaN-based semiconductor layer is formed on a silicon substrate.

(ii) Related Art

Semiconductor devices using a gallium nitride (GaN) based semiconductor are used as a power device operating at high frequencies and outputting high power, and a light emitting diode or a laser diode emitting light of short wavelengths. Particularly, there has been considerable activity in the development of semiconductor devices suitable for amplification in a high-frequency or RF (radio Frequency) band such as a microwave band, a quasi-millimeter band or a millimeter band. Examples of those semiconductor devices are an FET such as a high electron mobility transistor (HEMT) and light emitting devices such as a laser diode (LD) and a light emitting diode (LED).

Generally, a sapphire substrate or a silicon carbide (SiC) substrate is used as a substrate on which the GaN-based semiconductor layer is grown. Since the sapphire substrate and the SiC substrate are expensive, there has been developed an art of growing the GaN-based semiconductor layer on the silicon (Si) substrate. As Si and Ga react easily, an AlN layer is interposed between the Si substrate and the GaN-based semiconductor layer as a barrier layer (see Japanese Patent Application Publication No. 2008-166349).

However, a pit-like defect may occur on the surface of the AlN on the Si substrate. In case where the GaN-based semiconductor layer is formed on the AlN layer on which many pit-like defects occur in order to form a HEMT, for example, a process for fabricating the transistor may be affected. For example, electrodes may not be formed reliably. Another problem is a deterioration of the crystal quality of the GaN-based semiconductor layer, which leads to a degradation of the transistor characteristics.

SUMMARY

According to an aspect of the present invention, there is provided a method for fabricating a semiconductor device including: performing thermal cleaning for a surface of a silicon substrate in an atmosphere including hydrogen under a condition that a thermal cleaning temperature is higher than or equal to 700° C. and is lower than or equal to 1060° C., and a thermal cleaning time is longer than or equal to 5 minutes and is shorter than or equal to 15 minutes; forming a first AlN layer on the silicon substrate with a first V/III source ratio, the forming of the first AlN layer including supplying an Al source to the surface of the silicon substrate without supplying a N source thereto after the thermal cleaning, and supplying both the Al source and the N source after the supplying of the Al source; forming a second AlN layer on the first AlN layer with a second V/III source ratio that is greater than the first V/III source ratio; and forming a GaN-based semiconductor layer on the second AlN layer.

DETAILED DESCRIPTION

Now, a description is given, with reference to the accompanying drawings, of embodiments of the present invention.

First Embodiment

Figure 1A:
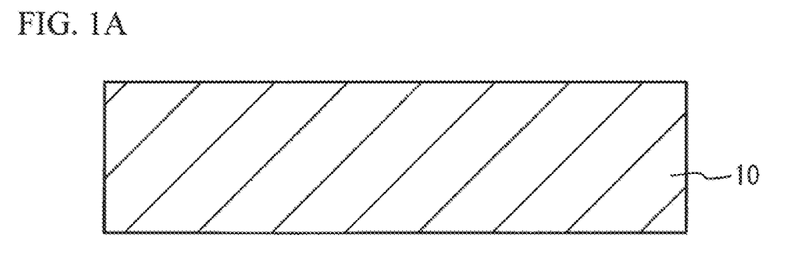
FIGS. 1A through 1D are cross-sectional views that illustrate a method for fabricating a semiconductor device in accordance with a first embodiment.

A description is first given of a method for fabricating a semiconductor device in accordance with a first embodiment. FIGS. 1A through 2B are cross-sectional views that illustrate the method for fabricating the semiconductor device in accordance with the first embodiment. The steps in FIGS. 1A through 2A are carried out in a reactor of a MOCVD (Metal Organic Chemical Vapor Deposition) chamber without taking a wafer out of the reactor. As illustrated in FIG. 1A, a surface of a Si substrate 10 having a principal plane that is a (111) plane is treated by thermal cleaning within the reactor of the MOCVD chamber. The condition for the thermal cleaning is such that the thermal cleaning temperature is higher than or equal to 700° C. and is lower than or equal to 1060° C., the thermal cleaning time is longer than or equal to 5 minutes and is shorter than or equal to 15 minutes, and an atmosphere including hydrogen (an atmosphere in which hydrogen is included in a carrier gas) is used.

Figure 1B:
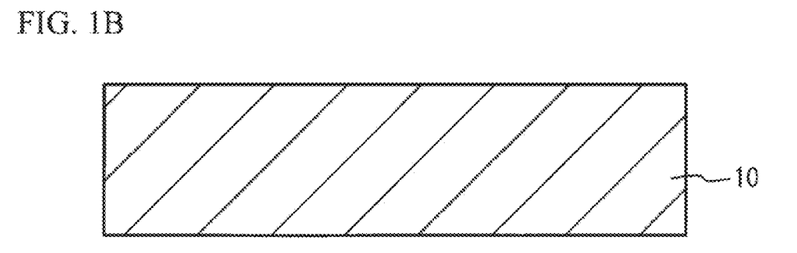
Figure 1C:
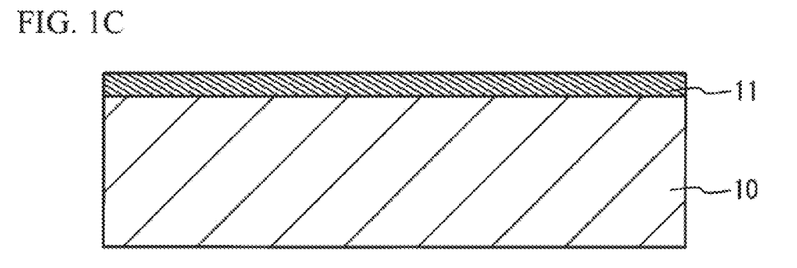
Figure 1D:
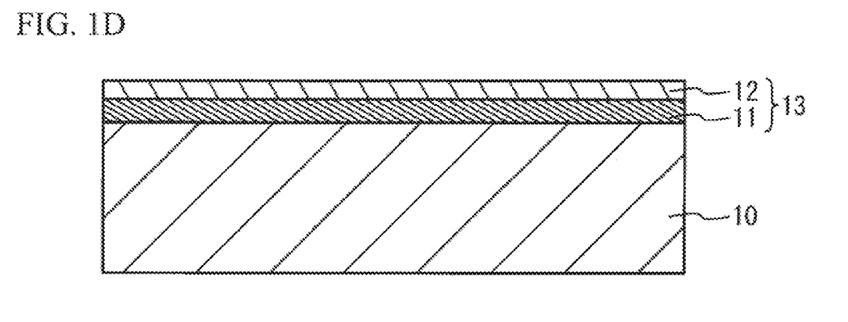

As illustrated in FIG. 1B, an Al source is supplied to the surface of the Si substrate 10 while a N source is not supplied. This is called a pre-flow of the Al source. Then, as illustrated in FIG. 1C, the Al source and the N source are supplied to grow a first AlN layer 11 on the Si substrate 10 with a first V/III ratio. As illustrated in FIG. 1D, a second AlN layer 12 is grown on the first AlN layer 11 with a second V/III ratio greater than the first V/III ratio. The first AlN layer 11 and the second AlN layer 12 form an AlN layer 13.

Figure 2A:
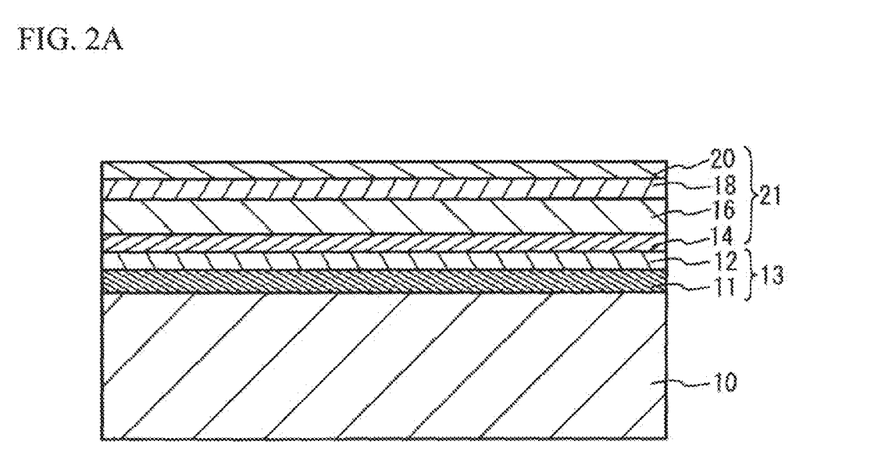
FIGS. 2A and 2B are cross-sectional views of steps following the step illustrated in FIG. 1D.

A step illustrated in FIG. 2A is to grow a GaN-based semiconductor layer 21 on the second AlN layer 12. The GaN-based semiconductor layer 21 may be composed of an AlGaN buffer layer 14, an undoped GaN layer 16, an n-type AlGaN electron supply layer 18, and an n-type GaN cap layer 20. For example, the AlGaN buffer layer 14 may have a thickness of 100 nm, and an Al composition ratio of 0.5. The undoped GaN layer 16 may have a thickness of, for example, 1000 nm. The n-type AlGaN layer 18 may have a thickness of 20 nm, and an Al composition ratio of 0.2, for example. The n-type GaN cap layer 20 has a thickness of, for example, 2 nm.

Figure 2B:
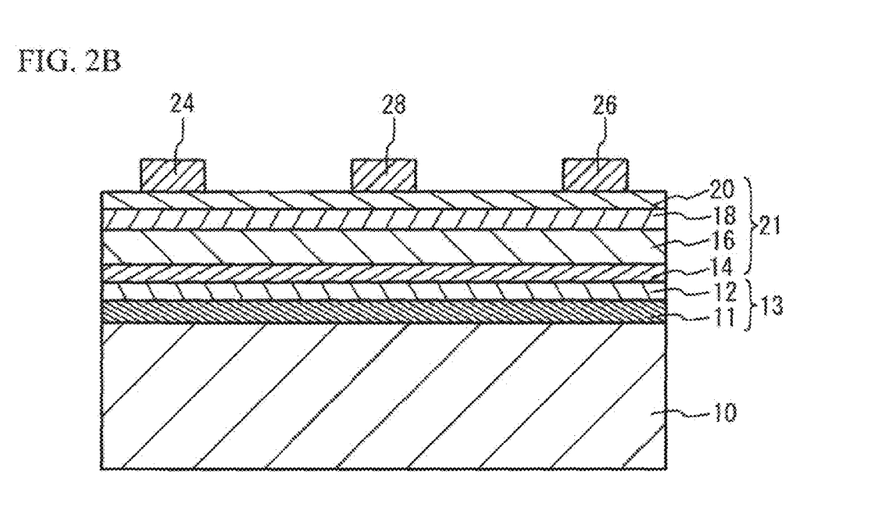

As illustrated in FIG. 2B, a source electrode 24, a drain electrode 26 and a gate electrode 28 are formed on the GaN layer 20. Each of eh source electrode 24 and the drain electrode 26 is an ohmic electrode, which may be formed by stacking Ti and Au on the GaN layer 20 in this order. The gate electrode 28 may be formed by stacking Ni and Au on the GaN layer 20 in this order. The HEMT of the first embodiment is fabricated through the above steps.

A sample A was fabricated as a first comparative example. The principal plane of the Si substrate 10 is the (111) plane, and the surface of the AlN layer on which layers are grown is the (0001) plane.

Thermal cleaning condition:
   Thermal process temperature: 1080° C.
   Thermal process time: 30 minutes
   Thermal process atmosphere: hydrogen 100 Torr (13.3 MPa)

Al source pre-flow condition:
   Al source: TMA (trimethylaluminium)
   Total quantity of pre-flow: 8 μmol
   Annealing temperature: 1050° C.

Figure 3:
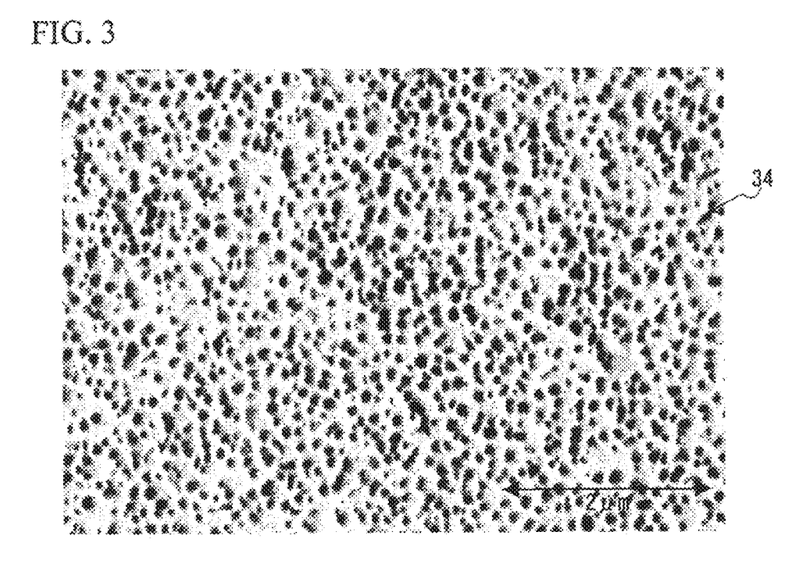
FIG. 3 is a picture of a SEM image of a surface of sample A.

AlN layer 13 forming condition (the growing condition for the first AlN layer 11 and that for
the second AlN layer 12 are the same as each other):
   N source: $NH_3$ (ammonia)
   Al source: TMA
   N material flow ratio: 50%
   Growth temperature: 1050° C.
   Growth thickness: 300 nm FIG. 3 is a picture of an image of the surface of the sample A by SEM (Scanning Electron Microscope). As shown in FIG. 3, many pit-like defects 34 are observed on the surface of the sample A. In a case where the thermal process temperature is higher than 1060° C., many pit-like defects 34 are observed on the surface of the AlN layer 13. In contrast, in a case where the terminal process temperature is lower than 700° C., it is difficult to remove impurities on the surface of the Si substrate 10. Thus, it is preferable that the thermal process temperature is higher than or equal to 750° C. and is lower than or equal to 1000° C. In a case where the thermal process time is longer than or equal to 15 minutes, there are many pits on the surface of the Si substrate 10. In contrast, in a case where the thermal process time is longer than or equal to 5 minutes, it is difficult to remove impurities on the surface of the Si substrate 10. It is preferable that the thermal process time is longer than or equal to 6 minutes and is shorter than or equal to 10 minutes. In case where a gas that does not include hydrogen is used as the thermal process atmosphere, much more pit-like defects are observed on the surface of the AlN layer 13. For example, much more pits are observed in a thermal process in an atmosphere that does not include hydrogen but includes nitrogen. It is considered that a reducing gas atmosphere is suitable for the thermal cleaning. As described, it is preferable to use an atmosphere including hydrogen for the thermal cleaning and is more preferably use a hydrogen atmosphere.

A sample B was fabricated as a second comparative example. The principal plane of the Si substrate 10 is the (111) plane, and the surface of the AlN layer on which layers are grown is the (0001) plane.

Thermal cleaning condition:
   Thermal process temperature: 1055° C.
   Thermal process time: 6 minutes
   Thermal process atmosphere: hydrogen 100 Torr Al source pre-flow condition:
   Al source: TMA
   Total quantity of pre-flow: depending on sample
   Annealing temperature: 1050° C.

AlN layer 13 forming condition (the growing condition for the first AlN layer 11 and that for the second AlN layer 12 are the same as each other):
   N source: $NH_3$
   Al source: TMA
   N material flow ratio: 50%
   Growth temperature: 1050° C.
   Growth thickness: 300 nm The inventors investigated a relationship between the crystal quality of the AlN layer 13 and the number of cracks observed after the GaN-based semiconductor layer 21 is formed. The crystal quality of the AlN layer 13 was measured by using an FWHM (Full Width at Half Maximum) of a rocking curve of a (002) plane of AlN by x-ray diffraction in the state of FIG. 1C after the AlN layer 13 is grown. Further, a sample grown under the same condition (the growth condition for the first AlN layer 11 and that for the second AlN layer 12 are the same as each other) was used to form the structure illustrated in FIG. 2A, and the number of cracks on the GaN-based semiconductor layer 21 within a 4-inch wafer was measured.

Figure 4:
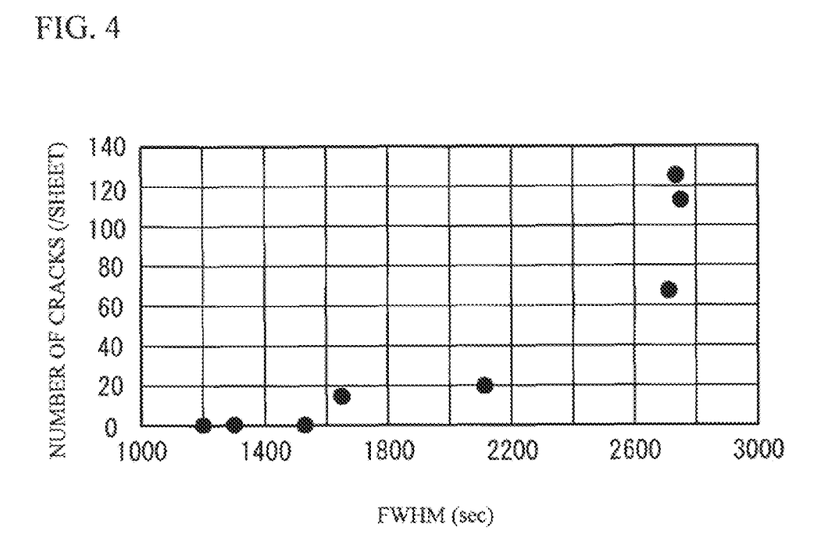
FIG. 4 is a diagram that illustrates the number of cracks associated with FWHM.

FIG. 4 is a graph of the number of cracks associated with the FWHM. As illustrated in FIG. 4, the number of cracks reduces when the FWHM is not greater than 1500 seconds. An improvement in the crystal quality of the AlN layer 13 reduces the number of cracks that occur in the GaN-based semiconductor layer 21.

Figure 5A:
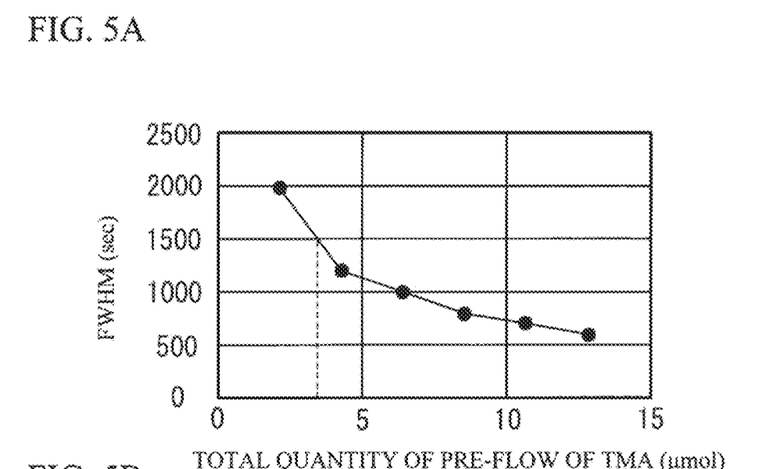
FIG. 5A is a diagram that illustrates a relationship between the total quantity of pre-flow of TMA and FWHM.
Figure 5B:
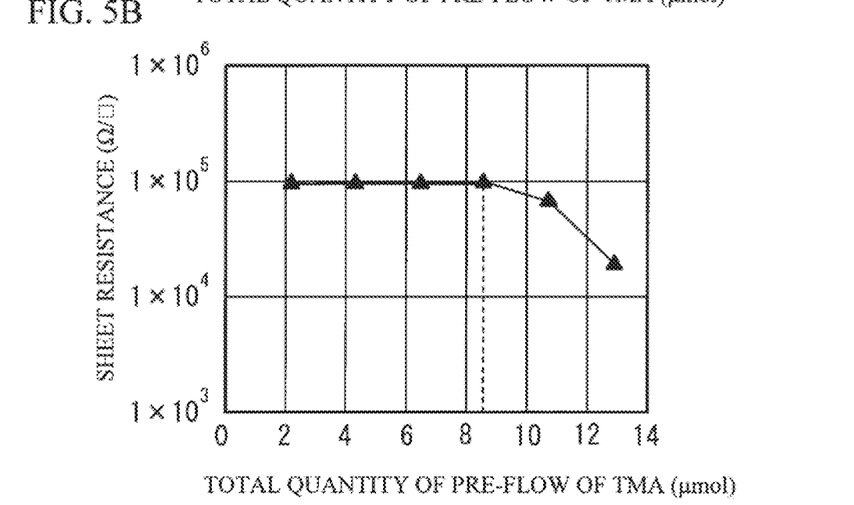
FIG. 5B is a diagram that illustrates a relationship between the total quantity of pre-flow of TMA and sheet resistance.

A description is now given of experiments in which the crystal quality of the AlN layer 13 and the sheet resistance thereof were measured by changing the total quantity of pre-flow of TMA. FIG. 5A is a graph of a relationship between the total quantity of pre-flow of TMA and FWHM, and FIG. 5B is a graph of a relationship between the total quality of the pre-flow of TMA and the sheet resistance. The measurement of the x-ray diffraction and the sheet resistance was carried out for a sample that was the semiconductor substrate illustrated in FIG. 1C.

The relationship illustrated in FIG. 5A is now described. The horizontal axis of the graph indicates the total quantity of pre-flow of TMA, and the vertical axis thereof indicates the FWHM of the AlN layer 13. As illustrated in FIG. 5A, as the total quantity of pre-flow of TMA increases, the FWHM decreases. That is, as the total quantity of pre-flow of TMA increases, the crystal quality of the AlN layer 13 is improved. Particularly, as indicated by a dotted line, the FWHM becomes less than 1500 seconds when the total quality of the pre-flow of TMA becomes greater than 3.5 μmol. As has been described with reference to FIG. 4, in the case where the FWHM is not greater than 1500 seconds, the number of cracks in the GaN-based semiconductor layer 21 is almost zero.

The graph of FIG. 5B is described below. The horizontal axis of the graph indicates the total quality of the pre-flow of TMA, and the vertical axis thereof indicates the sheet resistance of the semiconductor substrate in the state illustrated in FIG. 1C. Triangles in FIG. 5B indicate the sheet resistance due to the resistance of the Si substrate.

As illustrated in FIG. 5B, the sheet resistance is 100 kQ/□ when the total quality of the pre-flow of TMA is in the range of about 2 μmol to about 8 μmol. The sheet resistance of only the Si substrate 10 is 100 kQ/□. It was observed that the pre-flow of TMA hardly affected the sheet resistance of the Si substrate 10 when the total quality of the pre-flow of TMA is in the range of about 2 μmol to about 8 μmol. In contrast, as indicated by a dotted line in FIG. 5B, when the total quantity of pre-flow of TMA is greater than 8.8 μmol, the sheet resistance becomes smaller than 100 kQ/□. The above facts may result from a phenomenon in which Al supplied by the pre-flow of TMA diffuses into the Si substrate 10 and a resultant low-resistance layer is formed in the Si substrate 10. The low-resistance layer in the Si substrate 10 may lead to leakage after the semiconductor device is completed. For example, the FET, which is an exemplary semiconductor device fabricated by the present process may have a degraded RF characteristic. Even if the growth temperature is changed to 1040° C., the sheet resistance decreases when the quantity of pre-flow of TMA becomes greater than 8.8 μmol.

As described above, the total quantity of pre-flow of the Al source is preferably not less than 3.5 μmol, and is more preferably not less than 4 μmol. Further, the total quantity of pre-flow of the Al source is preferably not greater than 8.8 μmol, and is more preferably not greater than 7 μmol.

Figure 6:
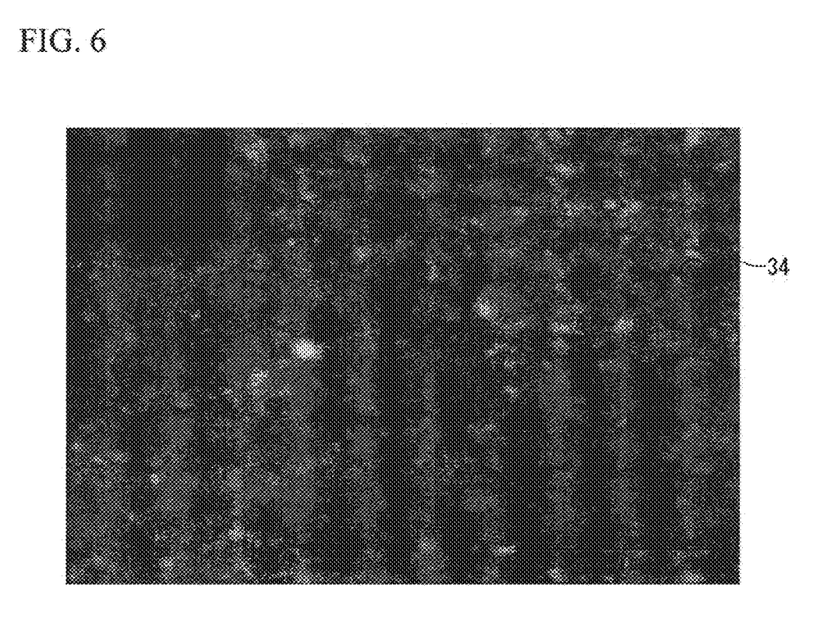
FIG. 6 is a picture of a SEM image of a surface of sample B.
Figure 7:
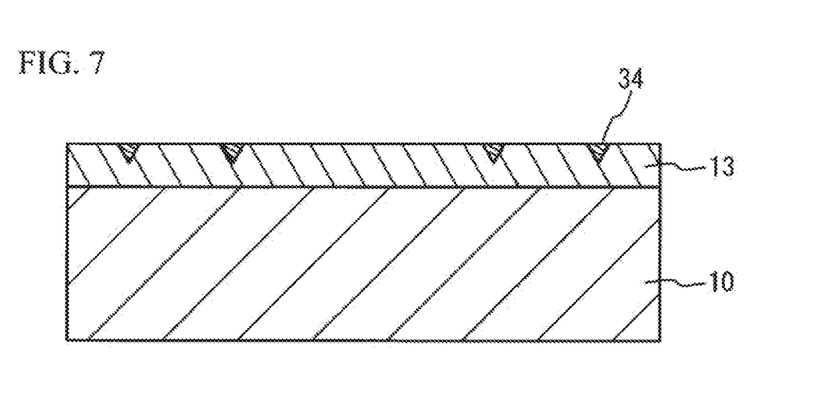
FIG. 7 is a schematic cross-sectional view of pit-like defects.

FIG. 6 is a picture of a SEM image of the surface of the AlN layer 13 of the sample B. The total quantity of pre-flow of TMA is 8 μmol. In FIG. 6, a black dot indicated by a reference numeral 34 is a pit-like defect. As illustrated, pit-like defects 34 are observed on the whole surface of the AlN layer 13, although a small number of pit-like defects 34 is observed, as compared with FIG. 3. It is noted that a white and black pattern observed on the whole surface of the AlN layer 13 besides the pit-like defects results from the fact that an electrically n-type surface portion (comparatively many electrons) is observed as a black portion and an electrically p-type surface portion (comparatively many holes) is observed as a white portion. FIG. 7 is a schematic cross-sectional view of pit-like defects. As illustrated in FIG. 7, concave pit-like defects 34 are formed on the surface of the AlN layer 13.

As described above, the thermal cleaning is performed and the pre-flow of the Al source is further performed, nevertheless, pit-like defects are observed on the surface of the AlN layer 13. In the sample B, the N source flow ratio is set to 50% in order to improve the crystal quality of the AlN layer 13. Since the crystal quality of the AlN layer 13 is affected by the number of cracks, it is required to prevent the crystal quality of the AlN layer 13 from being degraded. The inventors divided the AlN layer 13 into two layers of the first AlN layer 11 and the second AlN layer 12 and set the N source flow ratio for the first AlN layer 11 to a comparatively high level in order to improve the crystal quality of the AlN layer. Further, the inventors set the N source for the second AlN layer 12 that forms the surface of the AlN layer 13 to a comparatively low level. The inventors found out that the above division and setting reduce the number of pits on the surface of the AlN layer 13. The ratio (Al source flow ratio)/(N source flow ratio) is defined as a V/III source ratio.

The details of the experiment are described below. A sample C was fabricated as the first embodiment. The principal plane of he Si substrate 10 is the (111) plane, and the growth plane of the AlN layer is (0001) plane.
Thermal cleaning condition:
  Thermal process temperature: 1055° C.
  Thermal process time: 6 minutes
  Thermal process atmosphere: hydrogen 100 Torr
Al source pre-flow condition:
  Al source: TMA
  Total quantity of pre-flow: 8 μmol
  Annealing temperature: 1050° C.

Figure 8:
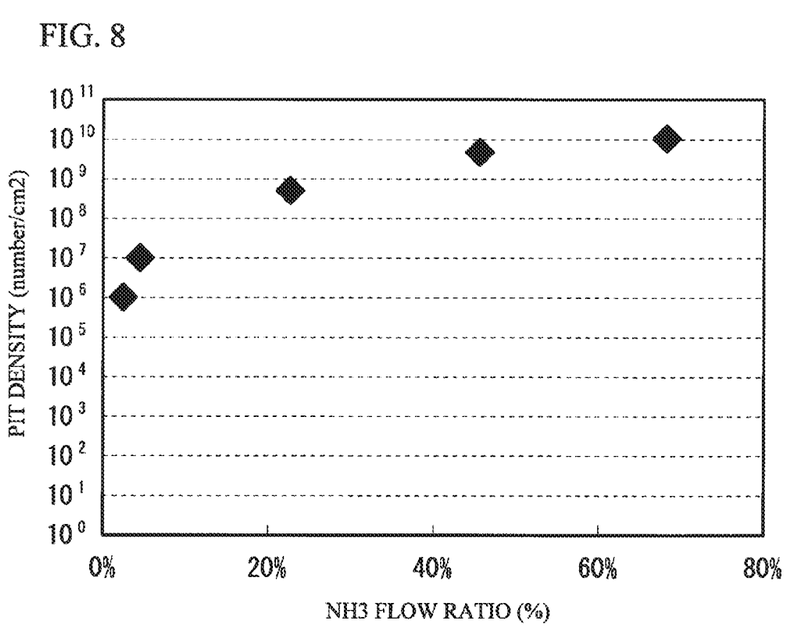
FIG. 8 is a diagram that illustrates a pit density associated with an $NH_3$ flow ratio.

First AlN layer 11 forming condition:
  N source: $NH_3$
  Al source: TMA
  N material flow ratio: 50%
  Growth temperature: 1050° C.
  Growth thickness: 15 nm
Second AlN layer 12 forming condition:
  N source: $NH_3$
  Al source: TMA
  N material flow ratio: depending on sample
  Growth temperature: 1050° C.
  Growth thickness: 285 nm FIG. 8 is a graph of the pit density associated with the $NH_3$ flow ratio. The $NH_3$ flow ratio is the ratio of the quantity of flow of $NH_3$ that is the N source to the total quantity of flow of the source gases (total quantity of flow of the N source and the Al source). The pit density is the density of pits on the surface of the second AlN layer 12 in FIG. 1D. The pit density was obtained by counting pits on the SEM image and dividing the number of pits by the area. As illustrated in FIG. 8, the pit density starts to decrease when the $NH_3$ flow ratio becomes lower than 50%, and further decreases when the $NH_3$ flow ratio becomes lower than 25%. The pit density is very low when the $NH_3$ flow ratio is lower that 5%.

Figure 9:
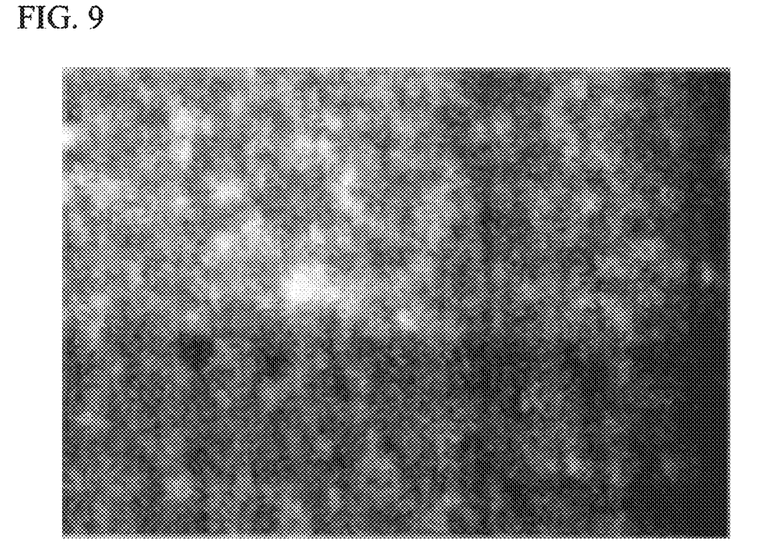
FIG. 9 is a picture of a SEM image of a surface of sample C.

FIG. 9 is a picture of a SEM image of the surface of the second AlN layer 12 of the sample C when the $NH_3$ flow ratio for the second AlN layer 12 is set equal to 3%. As illustrated in FIG. 9, pit-like defects are little observed. A white and back pattern results from the same reason as has been described with reference to FIG. 6.

As described above, the crystal quality of the AlN layer 13 can be secured and the bit density can be reduced by growing the second AlN layer 12 by using the second V/III source ratio that is greater than the first V/III source ratio used for growing the first AlN layer 11. The ratio (the first V/III source flow ratio)/(the second V/III source flow ratio) is preferably greater than or equal to 2 (the $NH_3$ flow ratio is less than or equal to 25% in FIG. 8), and is more preferably greater than or equal to 10 (the $NH_3$ flow ratio is less than or equal to 5% in FIG. 8). The AlN layer 13 may be formed by preferably setting the ratio (the first V/III source flow ratio)/(the second V/III source flow ratio) to not greater than 4000 and by more preferably setting the ratio to not greater than 1000.

The above description is summarized below. The thermal cleaning is carried out in a hydrogen atmosphere under the condition that the thermal cleaning temperature is higher than or equal to 700° C. and is lower than or equal to 1060° C., and the thermal cleaning time is longer than or equal to 5 minutes and is shorter than or equal to 15 minutes. The Al source is supplied while the N source is not supplied, and then both the Al source and the N source are supplied. Thus, the first AlN layer 11 is grown on the Si substrate 10 with the first V/III source ratio. Thereafter, the second AlN layer 12 is formed on the first AlN layer 11 with the second V/III source ratio that is greater than the first V/III source ratio. It is thus possible to suppress the occurrence of pit-like defects on the surface of the AlN layer 13. This makes it possible to suppress the adverse effects on the process for fabricating the transistor due to the pit-like defects and to suppress the degradation of the transistor characteristics.

As illustrated in FIG. 5A, the total quantity of pre-flow of the Al source is preferably not less than 3.5 μmol in order to improve the AlN layer 13.

The Al source is not limited to TMA but may be another material such as triethylaluminium (TEA). The N source is not limited to $NH_3$ but may be dimethylhydrazine. In order to suppress the occurrence of leakage current, the sheet resistance is preferably not less than 100 kΩ/□, and is more preferably not less than 150 kΩ/□, and much more preferably not less than 200 kΩ/□.

In case where the total thickness of the first AlN layer 11 and the second AlN layer 12 is too small, the AlN layer 13 may not function as the buffer layer sufficiently. In this case, impurities such as Ga that diffuse into the Si substrate 10 serve as dopants, which may cause a leakage current. In contrast, in case where the total thickness is too large, the semiconductor device may have a warp due to stress. Thus, it is preferable that the thickness of the AlN layer 13 is not less than 200 nm and is not greater than 400 nm. The thickness of the AlN layer 13 may be not less than 250 nm and may be not greater than 350 nm. In order to improve the crystal quality of the AlN layer 13, the first AlN layer 11 is preferably thinner than the second AlN layer 12. The thickness of the second AlN 12 is preferably not less than 100 nm and is not greater than 400 nm in terms of suppression of the pit density. More preferably, the thickness of the second AlN layer is not less than 200 nm and is not greater than 350 nm.

The GaN-based semiconductor is a semiconductor including GaN, and includes, besides GaN and AlGaN, InGaN that is a mixed crystal of GaN and InN (indium nitride) and AlInGaN that is a mixed crystal of GaN, AlN and InN. The GaN-based semiconductor layer 21 may include any of the above-described GaN-based semiconductor besides the above-described structures.

The present invention is not limited to HEMT but may include transistors such as FETs besides HEMT. The present invention may include laser diodes and photodiodes.

The present invention is not limited to the specifically described embodiments but includes other embodiments and variations within the scope of the claimed invention.

What is claimed is:

1. A method for fabricating a semiconductor device comprising:
    performing thermal cleaning for a surface of a silicon substrate in an atmosphere including hydrogen under a condition that a thermal cleaning temperature is higher than or equal to 700° C. and is lower than or equal to 1060° C., and a thermal cleaning time is longer than or equal to 5 minutes and is shorter than or equal to 15 minutes;
    forming a first AlN layer on the silicon substrate with a first ratio (Al source flow ratio)/(N source flow ratio), the forming of the first AlN layer including supplying an Al source with a total quantity of pre-flow not less than 3.5 µmol to the surface of the silicon substrate without supplying a N source thereto immediately after the thermal cleaning, and supplying both the Al source and the N source after the supplying of the Al source;
    forming a second AlN layer on the first AlN layer with a second ratio (Al source flow ratio)/(N source flow ratio) that is greater than the first ratio (Al source flow ratio)/(N source flow ratio); and
    forming a GaN-based semiconductor layer on the second AlN layer,
    wherein total thickness of the first AlN layer and the second AlN layer is not less than 200 nm and is not greater than 400 nm,
    wherein a ratio of quantity of flow of the N source gas to a total quantity of flow of the N source and the Al source gases used in the forming of the second AlN layer is less than or equal to 25%.

2. The method according to claim 1, wherein the N source of the first and second AlN layer is ammonia, and the Al source of the first and second AlN layer is TMA.

3. The method according to claim 1, wherein the Al source is supplied by 3.5 µmol or more.

4. The method according to claim 1, wherein the GaN-based semiconductor layer comprises any of GaN, AlGaN, InGaN, and AlInGaN.

5. The method according to claim 1, wherein total thickness of the first AlN layer and the second AlN layer is not less than 250 nm and is not greater than 350 nm.

6. The method according to claim 1, wherein the first AlN layer is thinner than the second AlN layer.

7. The method according to claim 6, wherein the second AlN layer is not less than 100 nm and is not greater than 400 nm.

8. The method according to claim 7, wherein the second AlN layer is not less than 200 nm and is not greater than 350 nm.

9. The method according to claim 1, wherein the total quantity of preflow is set such that a FWHM of the first AlN layer and the second AlN layer is not greater than 1500 seconds.

* * * * *